(12) United States Patent
Brates et al.

(10) Patent No.: US 8,154,211 B2
(45) Date of Patent: Apr. 10, 2012

(54) END-OF-LIFE PROTECTION CIRCUIT AND METHOD FOR HIGH INTENSITY DISCHARGE LAMP BALLAST

(75) Inventors: Nanu Brates, Winchester, MA (US); Bhavinkumar Shah, Burlimgton, MA (US); Yiyoung Tony Sun, Beverly, MA (US)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 12/578,093

(22) Filed: Oct. 13, 2009

(65) Prior Publication Data
US 2011/0084613 A1 Apr. 14, 2011

(51) Int. Cl.
| | |
|---|---|
| *H05B 37/00* | (2006.01) |
| *H05B 41/00* | (2006.01) |
| *H05B 37/02* | (2006.01) |
| *H05B 39/02* | (2006.01) |
| *H05B 39/04* | (2006.01) |
| *H05B 41/36* | (2006.01) |
| *H05B 39/00* | (2006.01) |
| *H01J 11/04* | (2011.01) |
| *H01J 13/48* | (2006.01) |
| *H01J 17/36* | (2006.01) |
| *H01J 15/04* | (2006.01) |

(52) U.S. Cl. ............... 315/119; 315/209 R; 315/326
(58) Field of Classification Search .............. None
See application file for complete search history.

(56) References Cited

U.S. PATENT DOCUMENTS

| | | | |
|---|---|---|---|
| 5,808,422 A * | 9/1998 | Venkitasubrahmanian et al. .................... | 315/225 |
| 6,281,641 B1 * | 8/2001 | Chen et al. .................... | 315/307 |
| 7,064,499 B2 * | 6/2006 | Lott .............................. | 315/291 |
| 2002/0047609 A1 | 4/2002 | Weng | |
| 2004/0183463 A1 | 9/2004 | Sun et al. | |
| 2005/0093477 A1 * | 5/2005 | Shi .............................. | 315/224 |
| 2007/0063659 A1 | 3/2007 | Yamashita et al. | |
| 2009/0267517 A1 | 10/2009 | Tanaka et al. | |
| 2009/0315470 A1 | 12/2009 | Kumagai et al. | |

* cited by examiner

*Primary Examiner* — Douglas W Owens
*Assistant Examiner* — Dedei K Hammond
(74) *Attorney, Agent, or Firm* — Greenblum & Bernstein, P.L.C.

(57) ABSTRACT

An apparatus and method thereof for igniting and operating a high intensity discharge (HID) lamp during an in service life, and powering down the lamp when an end-of-life (EOL) lamp condition is detected. The apparatus and method defines a series of thresholds of lamp voltage asymmetry, or rectification thresholds, and monitors the lamp rectification from ignition through normal operation. The detection scheme is masked off for a predetermined period of time when the lamp is initially started. Thereafter, the rectification threshold of the lamp voltage asymmetry is gradually reduced over time, until a defined minimum rectification threshold level is reached and maintained. The method continuously monitors the lamp voltage and records whenever the lamp voltage asymmetry is higher than the rectification threshold level at any lamp voltage cycle. An EOL lamp condition is determined to exist when a certain number of high asymmetrical cycles occurs in selected total number of lamp voltage cycles during a rolling measurement window.

17 Claims, 6 Drawing Sheets

END-OF-LIFE PROTECTION CIRCUIT AND METHOD FOR HIGH INTENSITY DISCHARGE LAMP BALLAST

BACKGROUND OF THE INVENTION

1. Field of the Invention

The present invention relates to an apparatus and method of an electronic ballast to ignite a high intensity discharge (HID) lamp. In particular, the present invention is directed to operating a HID lamp, to shutdown (e.g., turn OFF) a ballast associated with the HID lamp so as to terminate electrical output power to the HID lamp when an end-of-life (EOL) condition of the HID lamp is detected, and to then re-engage the ballast to re-supply electrical power to the HID lamp after a predetermined period of time (such as, for example, a few minutes) lapses from the shutdown. During operation of the HID lamp, a predetermined lamp voltage, such as, but not limited to, for example, a low frequency, square wave lamp voltage, is continuously monitored to calculate a lamp voltage rectification level. The lamp voltage rectification level is compared to a series of pre-defined, graduated rectification threshold levels. Whenever the lamp voltage rectification level exceeds the graduated rectification threshold level, a record is made. The HID lamp is determined to have reached its EOL condition when the number of records in a rolling measurement window becomes greater than a pre-defined percentage. At that time, the ballast is turned OFF to discontinue (terminate) the electrical output power supply to the HID lamp.

According to a preferred embodiment of the present invention, a frequency of the low frequency, square wave voltage and current is generally above 10 Hz and below 1000 Hz. However, this upper range and lower range may be varied without departing from the spirit and scope of the invention.

2. Background Art

As technology evolves, lamp manufacturers are developing smaller and more compact high intensity discharge lamps to satisfy the needs of end users. For example, some lamps are designed with a miniaturized fixture, in which a fixture protective lens is not required. When the lamp (e.g., an arc tube lamp) leaks, a gas, such as, but not limited to, for example, an argon gas, or when an outer envelope leaks, a nitrogen/oxygen gas mixture, etc. in the lamp, is released in a space between the arc tube lamp and an outer jacket, which is typically a vacuum. A resulting outer jacket gas pressure of the, for example, argon gas is a function of a numerical ratio of an arc tube volume to an outer jacket inner volume. Because of a relatively large outer jacket inner volume compared to the arc tube lamp volume, the resulting outer jacket gas pressure (e.g. argon) is significant higher than the vacuum. As a result, electrically insulating properties of the vacuum are compromised; that is, a breakdown voltage of the lamp is substantially reduced, and stem lead arcing occurs when an ignition voltage is applied to the lamp.

SUMMARY OF THE INVENTION

An object of the invention is to provide an effective method to detect the EOL condition of a lamp and in order to discontinue the supply of electrical power to the lamp, while at the same time preventing a prematurely termination of electrical output power from a ballast to a normal lamp, so as to maximize its service life.

According to an advantage of the present invention, an operation of the ballast is re-started at a predetermined period of time, such as, but not limited to, a few minutes after an EOL lamp detector shut down the lamp, ensuring that electrical power to the lamp is not permanently disconnected until such time as a true EOL condition is encountered.

According to another advantage of the present invention, a rectification threshold level is gradually reduced from when the lamp start such that an EOL lamp can be differentiated from a lamp in service life whose rectification characteristics diminishes over time after starting.

According to an object of the present invention, a method is disclosed for detecting an end of life (EOL) condition of a lamp. A voltage is applied to the lamp to cause the lamp to start emitting light. A value representing the voltage applied to the lamp is measured at a predetermined timing after an expiration of a mask-off period, and a rectification calculation is performed to determine whether the lamp exhibits a rectification behavior indicating the EOL condition.

According to an advantage of the present invention, performing the rectification calculation comprises setting a rectification threshold, obtaining a predetermined number of rectification calculations, and determining whether a certain percentage of the predetermined number of rectification calculations exceed the set rectification threshold. The set rectification threshold setting may be changed, such as reduced, over time from when the lamp is started. When a measured lamp voltage rectification exceeds the rectification threshold, an occurrence of an event is recorded to an element of a data array, such as a memory, as a logic "1".

According to another object of the present invention, an apparatus is provided that powers a lamp and detects an end of life (EOL) condition of the lamp. A ballast applies a voltage to the lamp to cause the lamp to start emitting light. A measurer measures a value representing the voltage applied to the lamp at a predetermined timing after an expiration of a mask-off period. A calculator then performs a rectification calculation to determine whether the lamp exhibits a rectification behavior that indicates the EOL condition.

The calculator includes a setter that sets a rectification threshold, an obtainer that obtains a predetermined number of rectification calculations, and a determiner that determines whether a certain percentage of the predetermined number of rectification calculations exceeds the set rectification threshold.

According to a feature of the invention, the apparatus further includes a changer that changes, such as, reduces, the set rectification threshold over time from when the lamp is started.

According to another feature of the invention, the apparatus further comprises a data array, such as a memory, that stores an occurrence of an event as a logic "1" when a measured lamp voltage rectification exceeds the set rectification threshold.

The present invention teaches a method for detecting an end of life (EOL) condition of a lamp, by supplying a voltage to the lamp to cause the lamp to emitting light, obtaining a number of rectification measurements during a predefined measurement window timing after an expiration of a mask-off period, determining whether a certain percentage of the number of rectification measurements during the predefined measurement window exceeds a set rectification threshold, and removing the voltage to the lamp when the number of rectification measurements during the predefined measurement window that exceeds the set rectification threshold is at least equal to the certain percentage.

The measurement window may be changed over time. In addition, the voltage to the lamp may be re-applied to restart the lamp a predetermined period of time after removing the voltage to the lamp. However, when the voltage to the lamp has been removed a certain number of times, re-applying of the voltage to the lamp is prevented.

Further, obtaining the number of rectification measurements during the predefined measurement window timing is defined as Y. In changing the measurement window timing, if X number of lamp rectification measurements are greater than the rectification threshold and X/Y is greater than a pre-defined (certain) percentage (which may be adjustable), the voltage to the lamp is removed.

The present invention is not limited to one specific topology. Thus, the EOL condition of a lamp may be accurately detected regardless of whether a resonant start type ballast or a pulse start type ballast is employed.

Still further, a statistical calculation is employed to discriminate between an EOL lamp condition and a lamp in service life (e.g., a good lamp) by examining how many over-threshold rectifications have occurred over a rolling, given measurement window.

BRIEF DESCRIPTION OF THE DRAWINGS

These and other objects, advantages and features of the present invention will become apparent from the following description thereof taken in conjunction with the accompanying drawings that illustrate specific embodiments of the present invention, in which.

DETAILED DESCRIPTION OF A PREFERRED EMBODIMENT

Figure 1:
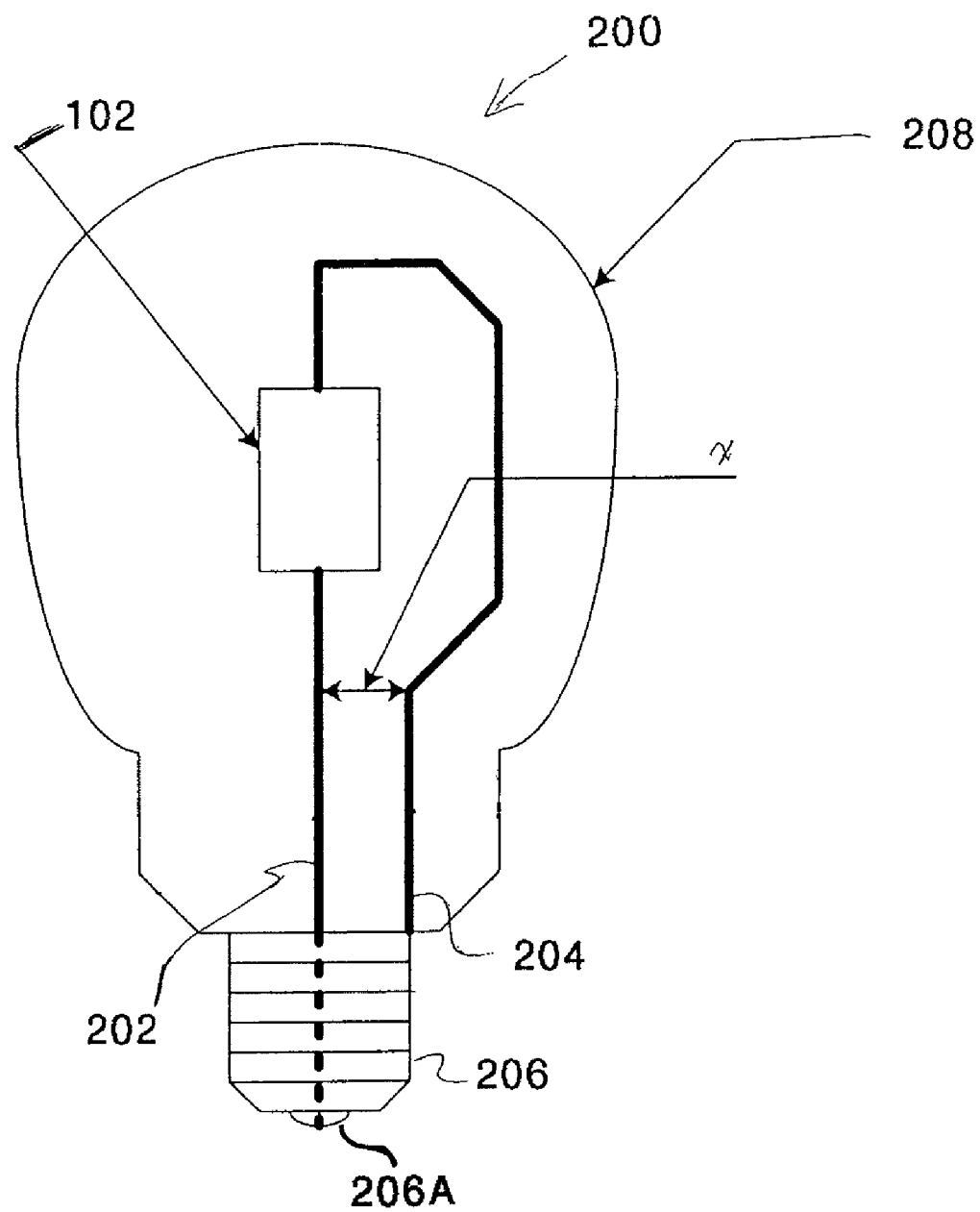
FIG. 1 illustrates a high intensity discharge (HID) lamp in which arcing occurs between stem leads when a gas leaks from an arc tube of the lamp.

FIG. 1 is an illustration of a typical HID lamp 200. Arc tube 102 of HID lamp 200 is electrically connected to a first stem lead 202 and a second stem lead 204. The stem leads 202 and 204 are electrically connected to a center contact 206A and a screw shell 206, respectively. Electrical power (not shown) is supplied to the arc tube 102 via the stem leads 202 and 206 and screw shell 206 and center contact 206A. The arc tube 102 and the stem leads 202 and 204 are surrounded by an outer jacket 208. The stem leads 202 and 204 are spaced apart from each other by a predetermined distance x, so as not to cause an electrical short there between.

The outer jacket 208 forms a vacuum with respect to the various components housed therein. However, when a gas associated with the arc tube 102 escapes from the arc tube 102, stem lead arcing may occur. If electrical power that is supplied from an associated ballast (not shown in FIG. 1) to the HID lamp 200 is not reduced or terminated, the arcing between the stem leads 202 and 204 can melt metal feedthroughs (not shown) of the lead stems 202 and 204. Should this occur, the outer jacket 208 of the HID lamp 200 may separate from the screw shell 206, resulting in the lamp "falling" off a socket (not shown) into which the screw shell 206 was screwed into. This is a very serious safety concern, and efforts should be taken to avoid such an occurrence.

Figure 2A:
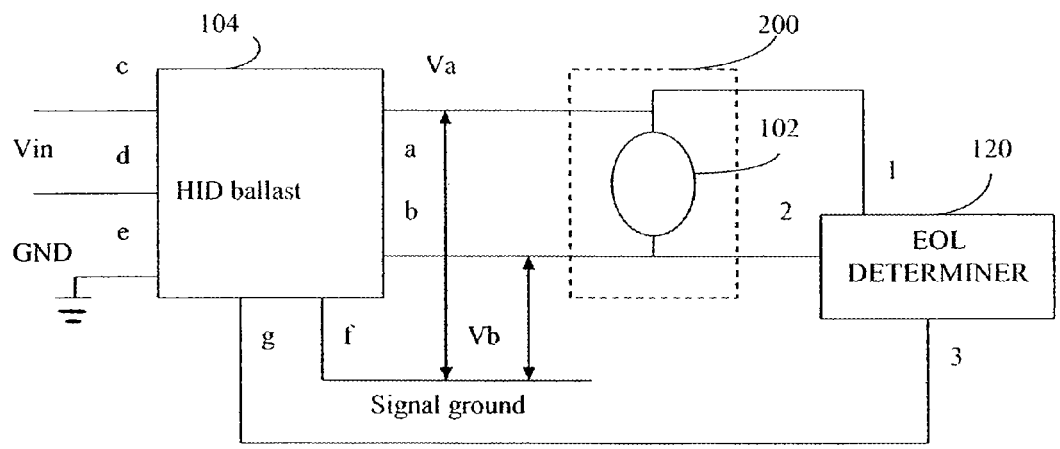
FIG. 2A illustrates a schematic diagram of the HID lamp of FIG. 1 connected to an HID ballast.

As shown in FIG. 2A, electrodes (stem leads 202 and 204) from the arc tube 102 of the HID lamp 200 are connected to ballast output terminals a and b of an HID ballast 104. An input voltage $V_{in}$ is inputted to the HID ballast via input terminals c and d. Terminal e is grounded, while terminal f serves as a signal ground.

A voltage Va is formed between terminals a and f, while voltage Vb is formed between terminals b and f. Thus, lamp voltage V_lamp applied to the arc tube 102 is equal to an absolute value of Va minus Vb.

An EOL determiner 120 is provided to determine the EOL condition of the lamp 200. In the disclosed embodiment, the EOL determiner 120 includes voltage terminals 1 and 2 and control line terminal 3. As shown in the embodiment illustrated in FIG. 2A, voltage terminals 1 and 2 are connected to terminals a and b of the HID ballast 104 to measure characteristics of the voltage supplied from the HID ballast 104 to the lamp 200. The control terminal 3 of the EOL determiner is connected, in the illustrated embodiment, to terminal g of the HID ballast 104 to control an ON/OFF operation of the HID ballast 104, as will be discussed below. However, it is understood that alternative methods of interfacing the EOL determiner 120 to the lamp 200 and/or HID ballast 104 may be implemented without departing from the scope and/or spirit of the present invention.

Figure 2B:
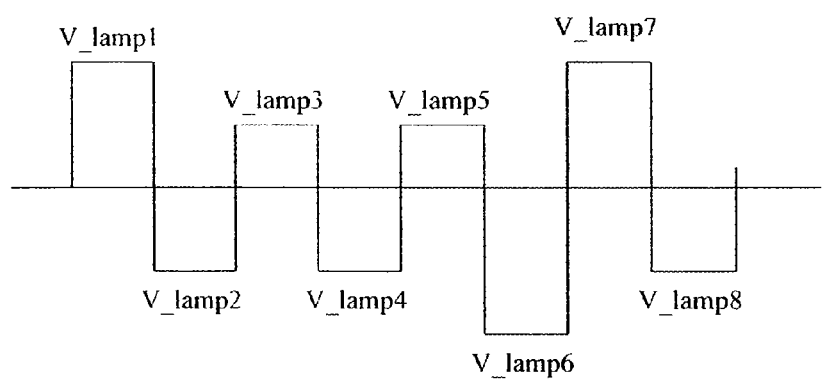
FIG. 2B illustrates a schematic waveforms and lamp voltage rectification calculations of the lamp of FIG. 2A.
Figure 2C:
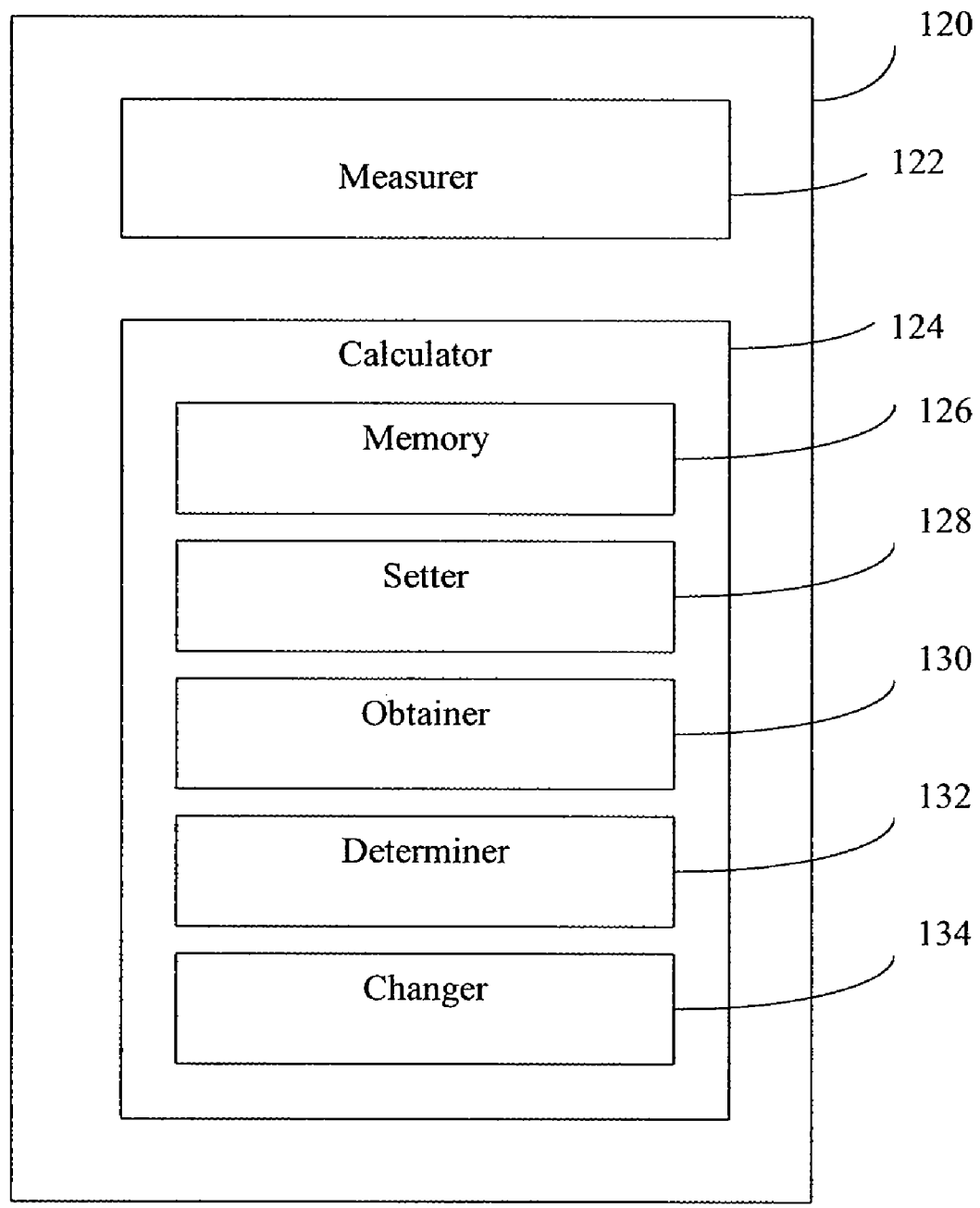
FIG. 2C illustrates a block drawing of an example of an end of life (EOL) determiner utilized by the current invention.

As shown in FIG. 2C, the EOL determiner includes a measurer 122 and a calculator 124. The measurer 122 functions to measure a value of the voltage applied to the lamp 200 at a predetermined timing after an expiration of a mask-off period (to be discussed below). The calculator 124 performs a rectification calculation to determine whether the lamp 200 exhibits a rectification behavior indicating an EOL condition.

The calculator 124 includes a memory 126, such as, for example, a data array, a setter 128, an obtainer 130, a determiner 132, and a changer 134. As will be described in greater detail below, the memory (data array) 126 stores an occurrence of an event when a measured lamp voltage exceeds a set rectification threshold. The setter 128 functions to set the threshold rectification. The obtainer 130 functions to obtain a predetermined number of rectification calculations. The determiner 132 operates to determine whether a certain percentage of the predetermined number of rectification calculations exceed the rectification threshold set by the setter 128. The changer 134 changes the set rectification threshold over time from when the lamp 200 is started. The operations of the various elements are described in detail below.

FIG. 2B illustrates waveforms associated with the operation of the HID lamp 200 for determining a plurality of lamp rectification voltages. According to the present invention, the lamp voltage V_lamp supplied by the HID ballast 104 is measured each half cycle by the EOL determiner 120 to calculate a lamp voltage difference $\Delta V\_lamp$ in two sequential half cycles. $\Delta V\_lamp$ is then compared to a pre-defined rectification threshold. When $\Delta V\_lamp$ is higher than the predetermined rectification threshold, the occurrence (event) is recorded, until a total number of half cycles has been measured in a given rolling measurement window.

A percentage of over-the-threshold half cycles is then calculated. When the calculated percentage result is higher than a pre-defined percentage, a control signal is outputted via terminal 3 of the EOL determiner 120 to terminal g of the HID ballast 104, which causes the HID ballast 104 to shut down, so as to discontinue the supply of electrical power to the HID lamp 200. However, it is recognized that alternative methods for removing electrical power to the lamp 200 may be implemented, such as, but not limited to, for example, electrically disconnecting the lamp 200 from the HID ballast 104, without departing from the scope and/or spirit of the present invention.

In the illustrated embodiment, the EOL determiner 120 issues a re-start command, via terminal 3, to the HID ballast 104 after the passage of a predefined rest interval, which may typically be a few minutes, so as to initiate a re-start operation of the lamp 200. However, it is understood that alternative methods may be utilized to re-start the lamp, such as, but not limited to, for example, incorporating a re-starter in the HID ballast, without departing from the scope and/or spirit of the current invention.

When the calculated percentage result is lower than the predefined percentage, the first measurement is discarded (dropped off). A new measurement is then taken and compared with the rectification threshold, the result recorded, and the percentage of over-the-threshold half cycles is re-calculated. This process is repeated for a pre-determined time interval.

In the disclosed embodiment, the pre-defined rectification threshold is varied over time from when the lamp is started. At an initial start-up, the rectification threshold is masked off to avoid a nuisance (e.g., erroneous) detection condition. After a period of time, the rectification threshold is gradually reduced. This is based on the fact that, for a good lamp, the level of lamp voltage rectification diminishes over time in a time frame of seconds, while an EOL lamp rectification does not diminish over time completely in a time frame of seconds. If the detection circuit does not detect an over-the-threshold rectification right after the masked off period, an EOL lamp condition will eventually be detected because of the rectification threshold reduction.

Figure 3:
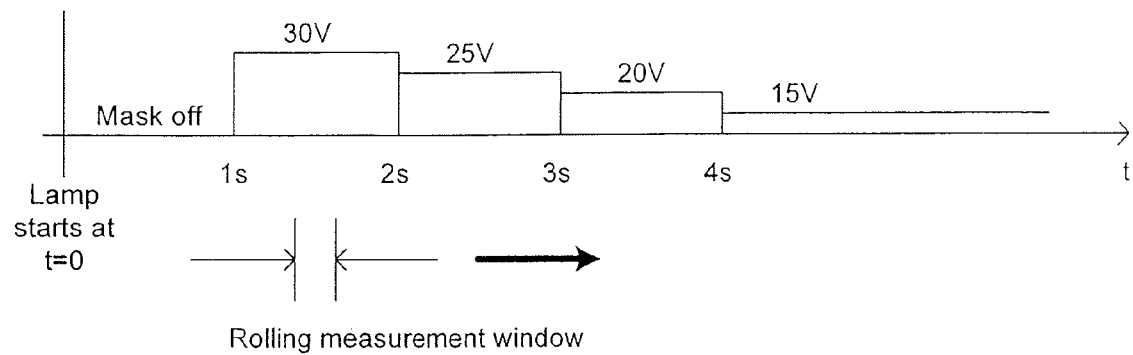
FIG. 3 illustrates an example of a rolling and graduated $\Delta V\_lamp$ rectification threshold (differential detection scheme)

FIG. 3 graphically illustrates a non-limiting example in which the rectification threshold is reduced. In the example of FIG. 3, which is shown for illustration purposes only, there are four stages of rectification threshold reduction from thirty (30) volts to fifteen (15) volts during the first four (4) seconds after the lamp is started. It is noted that threshold levels, elapsed times for each rectification threshold level, and the rolling measurement window can all be intelligently adjusted depending upon the design, without departing from the scope and/or spirit of the present invention.

For example, the mask-off period can be set to be just one second, as shown in FIG. 3, or, alternatively, may be set to some other time period, such as, but not limited to, for example, two seconds. In FIG. 3, the thirty (30) volt threshold level is shown to last for one second. However, the voltage and/or threshold level can be set to another level, such as, for example, forty-five (45) volts and/or for a period of, for example, 1.5 seconds without departing from the scope and/or or spirit of the invention.

The rolling measurement window may also be adjusted. For example, at the lamp start, the window width can be set to, for example, thirty-two (32) cycles of lamp voltage or current. In order to increase the sensitivity of detection a period of time after the lamp is started, the window can be narrowed to, for example, twenty-four (24) cycles of lamp voltage or current. The initial rectification percent can be set at, for example, 80 percent and later reduced to, for example, 50 percent to increase the sensitivity of EOL lamp detection, assuming that a good lamp still in its service life exhibits very low lamp voltage asymmetry. It is understood that all values disclosed herein are not critical to the operation of the present invention, and variations and changes may be made without deviating from the present invention.

Figure 4:
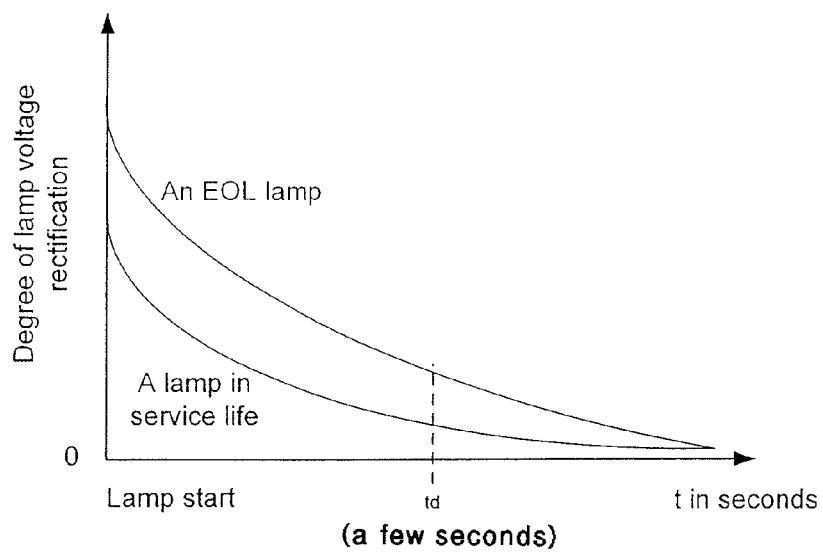
FIG. 4 illustrates a degree of lamp voltage rectification between a normal lamp and an EOL lamp.

The graduated rectification threshold reduction is based on the fact that, for a normal (i.e., good) lamp, rectification diminishes over time, while an EOL lamp rectification does not diminish over time, but rather reduces to a lower degree, as shown in FIG. 4. However, some good lamps during their service life will exhibit very severe rectification at when they are initially started, similar to that of an EOL lamp. In order to avoid prematurely shutting down the ballast output power when a good lamp is initially supplied with electrical power from the ballast, the initial rectification threshold level is set to a high enough value in the disclosed embodiment so as not to result in misjudging a good lamp still in its service life, while a final rectification threshold level is set low enough to ensure that the EOL lamp will be detected.

In a case where a premature shutdown does occur, the ballast will re-start after a predetermined period of time (such as, for example, a few minutes) after the ballast was shut down. A lamp that is still operable (e.g., an in-service life lamp) will start normally. If the ballast attempts to restart the lamp, without success, a certain number of times, the EOL lamp condition is determined to have been detected, and the ballast ceases attempting to restart the lamp.

Figure 5:
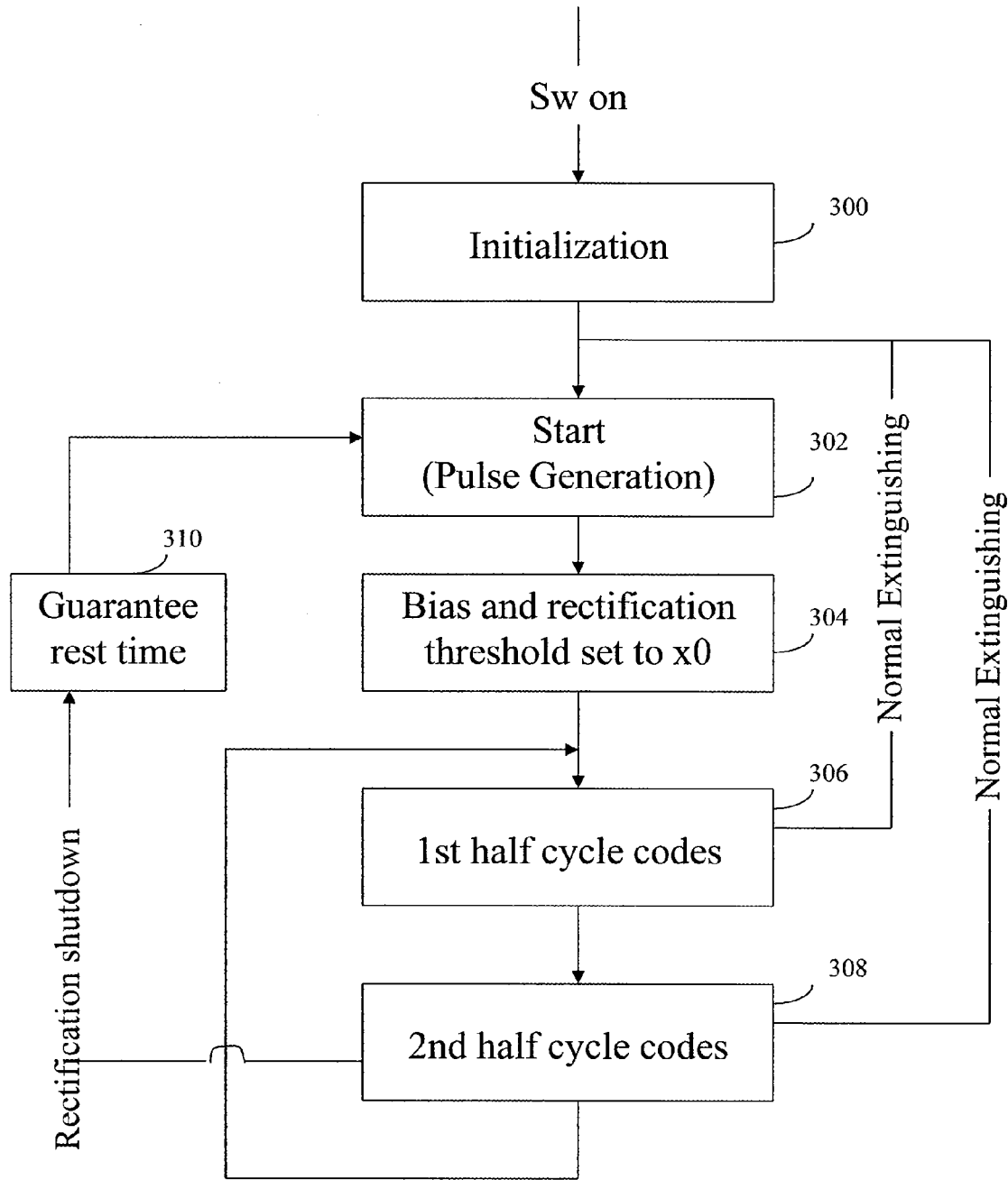
FIG. 5 illustrates an implementation example of a rectification detection method of the present invention.
Figure 6:
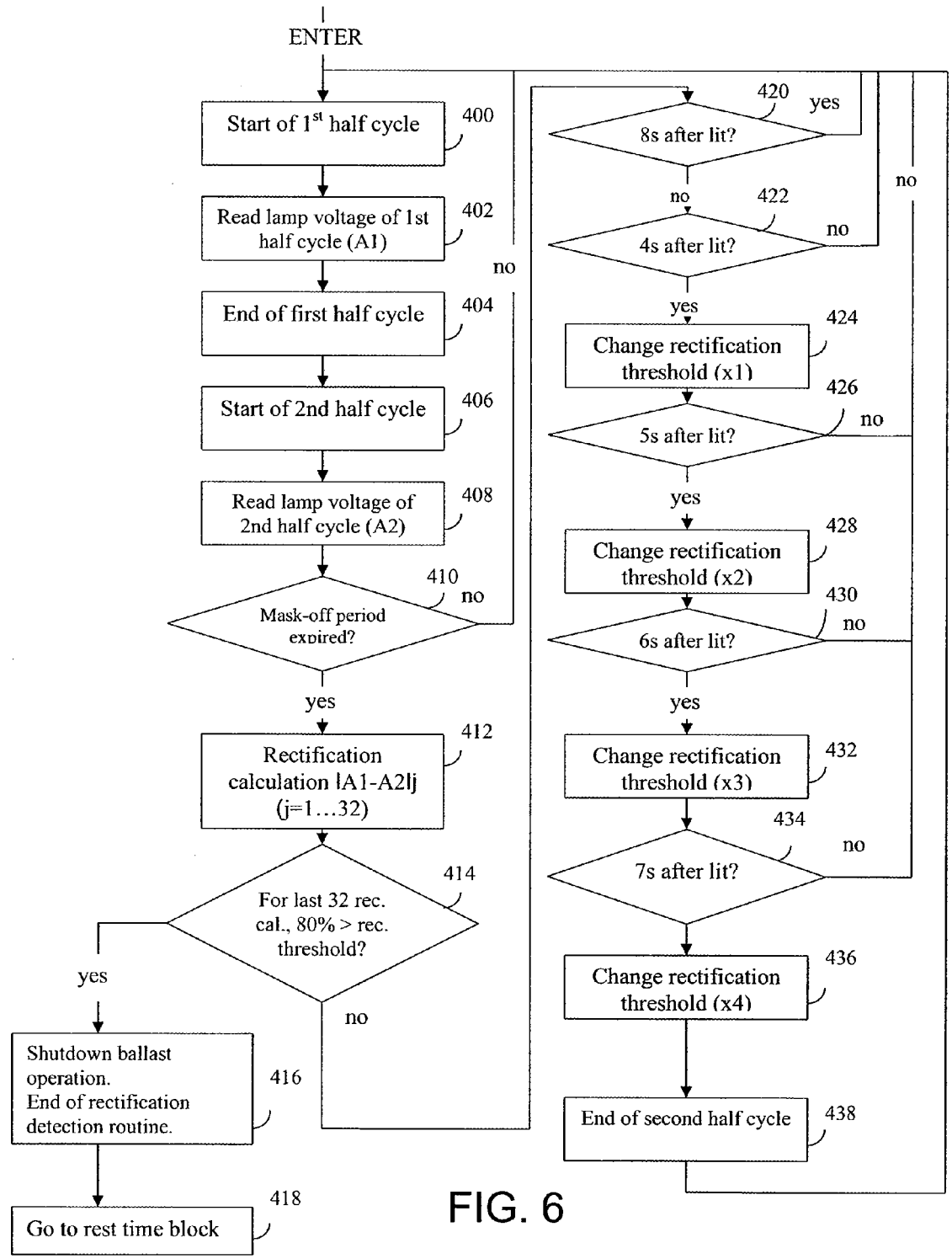
FIG. 6 illustrates a flowchart for performing first and second half cycle codes depicted in the rectification detection method of FIG. 5.

FIG. 5 illustrates a block diagram of a disclosed embodiment for implementing a rectification detection method of the present invention, while FIG. 6 illustrates a flowchart for implementing the rectification detection method of FIG. 5.

As shown in FIG. 5, rectification detection of the present invention is defined by tasks (operations) 300-310. However, it is understood that the tasks and the arrangement of the disclosed tasks may be changed without departing from the scope and/or spirit of the invention. When electrical power is applied to HID ballast 104 to start the arc tube 102 (HID lamp 200), an initialization (task 300) is performed. Pulse generation task 302 is executed. Bias and rectification threshold levels task 304 is then executed to set the bias and rectification threshold levels to desired levels. Thereafter, first and second half cycle code tasks 306 and 308 are performed to produce the signal illustrated in FIG. 2B, in accordance with the discussion above. Should the calculated percentage results from tasks 306 and 308 be higher than a pre-defined percentage, the HID ballast 104 is shut down, so as to discontinue the supplying of electrical power to the HID lamp 200. Rest time task 310 then re-starts (re-energizes) the HID ballast 104 once the predefined rest interval passes.

FIG. 6 depicts the operation of the first and second half cycle codes in greater detail. According to the disclosed embodiment, the first half cycle is started (step 400), and the lamp voltage of the first half cycle is read (step 402). The second half cycle then begins, and the lamp voltage of the second half cycle is read (steps 404, 406 and 408). At step 410, a determination is made as to whether the mask-off period has expired. If it is determined that the mask-off period has not expired, processing returns to step 400 to repeat steps 400 to 410, until such time as the mask-off period is determined to have expired.

When it is determined at step 410 that the mask-off period has expired, processing proceeds to step 412 to perform the rectification calculation, as discussed above with respect to FIG. 2B. As noted above, the pre-defined rectification threshold can be varied over time. Above, it was discussed that the initial rectification percent is set to 80 percent (and may later be reduced to increase the sensitivity of EOL lamp detection) and that the rolling measurement window is set to thirty-two (32) cycles. The rectification calculation results obtained from step 412 are compared to the rectification threshold, to determine whether 80 percent of the rectification calculations exceed the set rectification threshold. If the determination result is affirmative, processing proceeds to step 416 to shut down the HID ballast 104, end the rectification detection routine (step 416), and then wait for the elapse of the predetermined period of time before attempting to restart the lamp (step 418).

On the other hand, if the determination result at step 414 is negative, processing proceeds to step 420, where it is determined whether a first time period, such as, but not limited to, in the disclosed embodiment, of eight (8) seconds, has passed after the lamp was lit. An affirmative determination results in processing returning to step 400, while a negative determination results in another determination being made, at step 422, as to whether a second time period, such as, but not limited to, four seconds in the disclosed embodiment, has elapsed since the lamp was lit. When the second time period (e.g., four (4) seconds) has elapsed, processing proceeds to step 424; otherwise processing returns to step 400.

At step 424, the rectification threshold is reduced to rectification threshold x1. As discussed above with respect to FIG. 3, reducing the rectification threshold increases the sensitivity of EOL lamp detection. Thereafter, it is determined whether a third time period, such as, but not limited to, five (5) seconds in the disclosed embodiment, has passed since the lamp was lit. If the determination is negative, processing returns to step 400 to re-execute steps 400 through 426.

Once the third time period (e.g., five (5) seconds in the disclosed embodiment) has passed since the lamp was lit, processing proceeds from step 426 to step 428, wherein the rectification threshold is further reduced to rectification threshold x2. Then, step 400 through step 430, as required, are repeatedly executed until such time as it is determined that a fourth time period, such as, but not limited to, six (6) seconds in the disclosed embodiment, has passed after the lamp was lit.

When the fourth time period has passed, processing proceeds to step 432, wherein the rectification threshold is reduced once more, to rectification threshold x3. In a manner similar to that described above, steps 400 through 434, as required, are repeatedly executed until such time as it is determined that a fifth time period, such as, but not limited to, seven (7) seconds in the disclosed embodiment, has passed since the lamp was lit.

In the disclosed embodiment, once the fifth time period after the lamp has been lit elapses, the rectification threshold is reduced to its final rectification threshold x4 and the second half cycle is ended (steps 436 and 438).

While the disclosed embodiment has been described with reference to specific time periods and number of rectification thresholds, it is understood that said time periods and number of rectification thresholds are merely exemplary examples for purposes of explaining the present invention. Thus, variations may be made thereto without departing from the scope and/or spirit of the instant invention.

The present invention enables the detection of the EOL of a lamp regardless of whether a resonant start type HID ballast or a pulse start type HID ballast is employed. A resonant start type ballast generates a resonant ignition voltage at the very beginning of a power up cycle. As the resonant ignition voltage gradually increases, the lamp breaks down and the discharge quickly transitions from a glow discharge to an arc discharge. A run-up mode then follows. A pulse start type ballast superimposes an ignition pulse on every half cycle of the lamp voltage. Because a pulse width of the ignition pulse is much narrower than a resonant ignition voltage, a glow to arc transition in the pulse start type ballast is generally slower than is the case with the resonant start type ballast. Thus, more rectification can be seen in a pulse start type ballast.

While it is somewhat easier to detect the EOL of a lamp that employs the pulse start type ballast, as opposed to a lamp that employs the resonant start type ballast, the present invention is not affected by which starting method is used in the ballast design. When to begin monitoring the lamp voltage rectification is solely based on the lamp voltage. Generally speaking, when the lamp voltage is less than 300 volts root mean square (Vrms), the lamp has started.

The foregoing discussion has been provided merely for the purpose of explanation and is in no way to be construed as limiting the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and/or spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

The methods described herein comprise dedicated hardware implementations including, but not limited to, application specific integrated circuits (ASIC), programmable logic arrays (PLA), digital signal processor (DSP) and other hardware devices constructed to implement the methods described herein. However, it is understood that the invention may be implemented in software that is executed by a processor, computer or dedicated integrated circuit (such as, for example, a PLA, DSP or PLA). Furthermore, alternative software implementations including, but not limited to, distributed processing or component/object distributed processing, parallel processing, or virtual machine processing can also be constructed to implement the methods described herein. In addition, although the present specification may describe components and functions implemented in the embodiments with reference to particular standards and protocols, the invention is not limited to such standards and protocols. Such standards are periodically superseded by faster or more efficient equivalents having essentially the same functions. Replacement standards and protocols having the same functions are considered equivalents.

We claim:

1. A method for detecting an end of life (EOL) condition of a lamp, comprising:
    applying a voltage to the lamp to cause the lamp to start emitting light;
    measuring a value representing the voltage applied to the lamp at a predetermined timing after an expiration of a mask-off period;
    performing a rectification calculation to determine whether the lamp exhibits a rectification behavior indicating the EOL condition; and
    changing a set rectification threshold setting over time from when the lamp is started, wherein changing the set rectification threshold setting comprises reducing the rectification threshold setting over time from when the lamp is started.

2. The method of claim 1, wherein performing a rectification calculation comprises:
    setting the rectification threshold;

obtaining a predetermined number of rectification calculations; and determining whether a certain percentage of the predetermined number of rectification calculations exceed the set rectification threshold.

3. The method of claim 2, further comprising recording an occurrence of an event to an element of a data array as a logic "1" when a measured lamp voltage rectification exceeds said rectification threshold.

4. An apparatus that powers a lamp and detects an end of life (EOL) condition of the lamp, comprising:

a ballast that applies a voltage to the lamp to cause the lamp to start emitting light;

a measurer that measures a value representing the voltage applied to the lamp at a predetermined timing after an expiration of a mask-off period;

a calculator that performs a rectification calculation to determine whether the lamp exhibits a rectification behavior indicating said EOL condition; and a changer that changes a set rectification threshold over time from when the lamp is started wherein changing said set rectification threshold over time comprises reducing said set rectification threshold.

5. The apparatus of claim 4, wherein said calculator comprises:

a setter that sets the rectification threshold;

an obtainer that obtains a predetermined number of rectification calculations; and a determiner that determines whether a certain percentage of said predetermined number of rectification calculations exceed said set rectification threshold.

6. The apparatus of claim 4, further comprising a data array that stores an occurrence of an event as a logic "1" when a measured lamp voltage rectification exceeds said set rectification threshold.

7. A method for detecting an end of life (EOL) condition of a lamp, comprising:

supplying a voltage to the lamp to cause the lamp to emit light;

obtaining a number of rectification measurements during a predefined measurement window timing;

determining whether a certain percentage of said number of rectification measurements during the predefined measurement window exceeds a set rectification threshold; and removing the voltage to the lamp when the number of rectification measurements during the predefined measurement window that exceeds the set rectification threshold is at least equal to the certain percentage.

8. The method of claim 7, further comprising changing the measurement window over time.

9. The method of claim 7, further comprising re-applying the voltage to the lamp to restart the lamp a predetermined period of time after removing the voltage to the lamp.

10. The method of claim 9, further comprising preventing re-applying of the voltage to the lamp, when the voltage to the lamp has been removed a certain number of times.

11. The method of claim 8, wherein obtaining a number of rectification measurements during a predefined measurement window timing is defined as Y, and in changing the measurement window timing, if X number of lamp rectification measurements are greater than the rectification threshold and X/Y is greater than a pre-defined percentage, the voltage to the lamp is removed.

12. The method of claim 11, further comprising re-applying the voltage to the lamp to restart the lamp a predetermined period of time after removing the voltage to the lamp.

13. The method of claim 12, further comprising preventing re-applying of the voltage to the lamp, when the voltage to the lamp has been removed a certain number of times.

14. The method of claim 7, wherein determining comprises performing a statistical calculation that discriminates between an EOL lamp condition and a lamp in service life condition by examining how many over-threshold rectifications have occurred over a rolling, given measurement window.

15. The method of claim 7, further comprising adjusting at least one of the measurement window, the rectification threshold, and the certain percentage.

16. The method of claim 7, wherein obtaining a number of rectification measurements during a predefined measurement window timing is performed after an expiration of a mask-off period.

17. The method of claim 7, wherein supplying a voltage to the lamp comprises supplying a voltage to a high pressure discharge lamp.

* * * * *